United States Patent
Goundar (10) Patent No.: US 7,138,332 B2
(45) Date of Patent: Nov. 21, 2006

(54) METHOD OF FORMING SILICON CARBIDE FILMS

(75) Inventor: Kamal Kishore Goundar, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 10/616,163

(22) Filed: Jul. 9, 2003

(65) Prior Publication Data

US 2005/0009320 A1   Jan. 13, 2005

(51) Int. Cl.
    *H01L 21/4763* (2006.01)
(52) U.S. Cl. ....................................... 438/624
(58) Field of Classification Search ................ 438/778, 438/649, 643, 638, 637, 629, 624, 623, 622, 438/618, 597; 427/249.15
    See application file for complete search history.

(56) References Cited

U.S. PATENT DOCUMENTS

| | | | |
|---|---|---|---|
| 5,800,878 A | 9/1998 | Yao | |
| 6,417,092 B1 | 7/2002 | Jain et al. | |
| 6,465,366 B1 | 10/2002 | Nemani et al. | |
| 6,589,888 B1 | 7/2003 | Nemani et al. | |
| 6,593,653 B1 | 7/2003 | Sundararajan et al. | |
| 6,627,525 B1 | 9/2003 | Chen et al. | |
| 6,627,535 B1 | 9/2003 | MacNeil et al. | |
| 6,668,752 B1 | 12/2003 | Yao | |
| 6,759,327 B1* | 7/2004 | Xia et al. | 438/643 |
| 6,777,394 B1 | 8/2004 | Prell | |
| 6,855,645 B1 | 2/2005 | Tang et al. | |
| 2001/0030369 A1 | 10/2001 | MacNeil et al. | |
| 2001/0031563 A1 | 10/2001 | Shioya | |
| 2001/0051445 A1 | 12/2001 | Shioya | |
| 2002/0027286 A1 | 3/2002 | Sundararajan et al. | |
| 2002/0142578 A1* | 10/2002 | Xia et al. | 438/623 |
| 2004/0126929 A1 | 7/2004 | Tang et al. | |
| 2004/0161535 A1* | 8/2004 | Goundar et al. | 427/249.15 |

FOREIGN PATENT DOCUMENTS

| EP | 0 771 886 A1 | 5/1997 |
|---|---|---|
| EP | 0 926 715 A2 | 6/1999 |
| JP | 2001-060584 | 3/2001 |

* cited by examiner

*Primary Examiner*—Laura M. Schillinger
*Assistant Examiner*—Monica D. Harrison
(74) *Attorney, Agent, or Firm*—Knobbe Martens Olson & Bear, LLP (57) ABSTRACT

To deposit silicon onto a substrate, there is introduced into a reaction zone a gas including source gases of silicon, carbon, nitrogen and an inert gas. An electric field is generated using low and high frequency RF power to produce a plasma discharge in the reaction zone to cause the deposition. The average power on the substrate is substantially constant. A ratio of low frequency RF power to total RF power is less than about 0.5.

26 Claims, 6 Drawing Sheets

FIG.3, SiCN Film forming sequence, outline of deposition recipe.

METHOD OF FORMING SILICON CARBIDE FILMS

FIELD OF THE INVENTION

The present invention relates to nitrogen doped silicon carbide layers referred to herein as SiCN and, more particularly to a method of forming low dielectric constant, low leakage current and high compressive stress nitrogen doped silicon carbide layers.

BACKGROUND OF THE INVENTION

Integrated circuits have evolved into complex devices that include multiple levels of metal layers to electrically interconnect discrete layers of semiconductor devices on a single semiconductor chip. Recently, with the evolution of higher integration and higher density of integrated circuit components, the demand for greater speed of the data transfer rate is required. For this reason, an insulating film having high compressive stress, low leakage current, low dielectric constant to give the small RC delay is employed.

As the device dimensions continuously shrink, the RC time delay of the interconnect system becomes one of the most important limitation factors to the integrated circuits performance. The RC delay is directly proportional to the resistivity of the metal and the dielectric constant of the dielectric. In order to minimize the signal propagation delay, it is inevitable to use low dielectric constant materials as the inter-layer and intra-layer dielectrics (ILD). While many low-k (k<3.0) materials have been used as ILDs, silicon nitride with a high dielectric constant (k>7.0) is still the primary candidate for the Etch Stop Layer (ESL) required in copper damascene structures. Thus, it is desirable to replace silicon nitride by new materials with lower dielectric constants to further reduce the effective dielectric constant of the Cu interconnect system. In recent years, increasing interest has been focused on the study of high stress and thermally stable low-k silicon carbide based films deposited by PECVD using organosilicon gases.

Furthermore, to reduce the size of interconnection lines and vias is to change the wiring materials from the conventional aluminum (Al) to copper (Cu) wiring having low electric resistance.

However, to produce a semiconductor device having multi-layered copper wiring, a low dielectric constant insulating layer is formed as the interlayer insulating film on the copper wiring.

The use of copper as the interconnect material has various problems. For example, copper is easily diffused into the low dielectric constant insulating film from the copper wiring, thus increasing the leakage current between the upper and lower wiring.

The use of silicon carbide films as copper diffusion barrier layers has been published in U.S. Pat. No. 5,800,878. The dielectric constant of this film is about 5, and in addition it is used as copper diffusion barrier layers for 130 nm-nodes Large Scale Integration (LSI) technologies where the dielectric constant of the interlayer dielectric film is 3.

For next generation, 100 nm/65 nm-nodes Ultra Large Scale Integration (ULSI) technologies, the reduction of interconnect capacitance is important for suppressing the signal delay as well as the power consumption. Interlayer dielectric films with dielectric constant less than 2.5 are used with copper damascene structures. To decrease the effective dielectric of fine pitched lines, further reduction in the dielectric constant is necessary not only for the inter layer dielectric film itself but also the supporting dielectric films such as hard mask, etch stop layers and copper diffusion barrier layers.

The interface between copper and copper diffusion barrier layer is known to be the key point for the electro-migration reliability of copper interconnects. The interface between copper and the copper diffusion barrier layer is the dominant diffusion path. However, there is no report on the identification of the dominant path for copper interconnects. On the other hand, the interface can be not only the dominant path but also the electro-migration induced void nucleation site.

The strength of adhesion between copper and diffusion layer would affect the electro-migration induced void nucleation because electro-migration induced void nucleates when copper atom at the interface is stripped away from the diffusion layer. Films with high compressive stress provide better adhesion with copper. It is also suggested that in order to prevent the migration of metal atoms, the film has to have high compressive stress such as above 200 MPa where the stress is stable even after being directly exposed to air at room temperature of about 20 to 30° C. Furthermore, the leakage current and dielectric constant of such film at 1 MV/cm has to be less than that of $1 \times 10^{-8}$ A/cm$^2$ and less than 5.0 respectively. SiCN films with dielectric constant less than 5 such that the leakage current at 1 MV/cm is less than $1 \times 10^{-8}$ A/cm$^2$ are suggested to be suitable to substitute for such films.

Using the silicon carbide film as an etch stop film was developed and presented in U.S. Pat. No. 5,800,878. A dielectric constant of the silicon carbide film is approximately 5. Silicon carbide films are applied to LSI devices using copper wiring in combination with carbon-containing silicon oxide films, whose dielectric constant is approximately 3. There are several different types of compositions for what is generally called silicon carbide films. One type is a silicon carbide film comprising Si, C and H. This film's stress and dielectric constant change if it is left in the atmosphere. This is due to the oxidation of the top surface of the silicon carbide film. The method to minimize the oxidation of carbon containing materials, such as silicon carbide, with an inert gas plasma such as helium (He), Argon (Ar) is published in JP laid-open patent 2001/0060584. This inert gas plasma treatment only minimizes the top surface of the silicon carbide film from getting oxidized, however, no changes/improvements to the film properties are observed.

The method of forming nitrogen doped silicon carbide (SiCN), oxygen doped silicon carbides (SiCO) has been published in U.S. Patent Application Publication 2001/0030369, U.S. Patent Application Publication 2002/0027286, U.S. Patent Application Publication 2001/0051445, and U.S. Patent Application Publication 2001/0031563. Furthermore; these films have been proposed as copper diffusion barrier layers. Though a silicon carbonitride layer has been proposed as a copper diffusion barrier layer with low leakage current, its dielectric constant is high and film stress is less compressive such as 5.5 and 100 MPa respectively.

In case of oxygen doped silicon carbide, although its dielectric constant is relatively low, such as less than 5, it cannot sufficiently refrain from increasing the leakage current. To decrease the leakage current to a sufficient level, the oxygen must be introduced much more into the silicon carbide film.

However, to do so, the leakage current can be reduced up to a satisfactory level, nevertheless a new problem is caused such that the surface of the copper wiring is oxidized and thus the barrier insulating film and the inter dielectric layer is ready to peel.

SUMMARY OF THE INVENTION

Thus, it is desired to develop a new method of forming etch stop layers and copper diffusion barrier layers that can be employed in the next generation, 100 nm/65 nm-nodes Ultra Large Scale Integration (ULSI) technologies, where the copper damascene structures are used.

The main characteristics of etch stop layers and copper diffusion barrier layers such as nitrogen doped silicon carbide films (SiCN) developed using various embodiments of the present invention are as follows:
a) The dielectric constant is less than 5.0
b) The film stress is compressive and is above 200 MPa.
c) No changes to its film properties such as changes to the film stress or changes to film dielectric constant are observed even when directly exposed to air at a room temperature between 20° C. to 30° C.
d) The leakage current at 1 MV/cm is extremely low, such as less than $1 \times 10^{-8}$ A/cm$^2$.
e) The etch selectivity of SiCN to SiOC (as intermediate dielectric), is higher than 3.

According to one preferred embodiment of the present invention, a method of forming low dielectric constant, low leakage current with high compressive stress silicon carbide film for use in integrated circuit fabrication processes is provided. The silicon carbide film is deposited on a substrate by introducing alkyl silicon compounds such as divinyl-dimethylsilane (Si(CH=CH$_2$)$_2$(CH$_3$)$_2$), tri-methylsilane (SiH(CH$_3$)$_3$) or tetra-methylsilane (Si(CH$_3$)$_4$) referred to herein as TMS, a substantial source of nitrogen such as ammonia (NH3) and nitrogen(N2) and an inert gas such as argon (Ar), helium (He), krypton (Kr), neon (Ne) or xenon (Xe) in the presence of an electric field in a plasma CVD reactor.

A mixture of high and low frequency RF power, such that high frequency RF power is in the range of 13.56 MHz to 30 MHz and low frequency RF power is in the range of 200 kHz to 500 kHz, wherein the ratio of low frequency to total power is less than about 0.5, generates the electric field. The leakage current and dielectric constant of the silicon carbide in this invention is decreased by introducing excess amount of nitrogen and inert gas.

DETAILED DESCRIPTION OF THE PREFERRED EMBODIMENT

Disclosed herein is a method for depositing a silicon carbide film having a low dielectric constant with low leakage current and high compressive stress onto a substrate in a CVD chamber, comprising the steps of providing a silicon source, carbon source, nitrogen source and an inert gas in a reaction zone containing a substrate, and reacting the silicon and carbon and nitrogen source in the presence of a plasma to deposit a low dielectric constant and low leakage current silicon carbide film on the substrate.

A mixture of high and low frequency RF power generates the electric field, wherein the ratio of low frequency to total power is less than about 0.5. The leakage current and dielectric constant in the resulting silicon carbide film is directly related to the carbon concentration, amount of nitrogen and inert gas introduced.

Silicon Carbide Layer Formation

In one preferred embodiment of the present invention, a silicon carbide layer is formed by reacting a gas mixture including, silicon source, carbon source, nitrogen source and an inert gas into a plasma enhanced chemical vapor deposition (PECVD) chamber. Details of the processing system are illustrated in FIG. 1.

Figure 1:
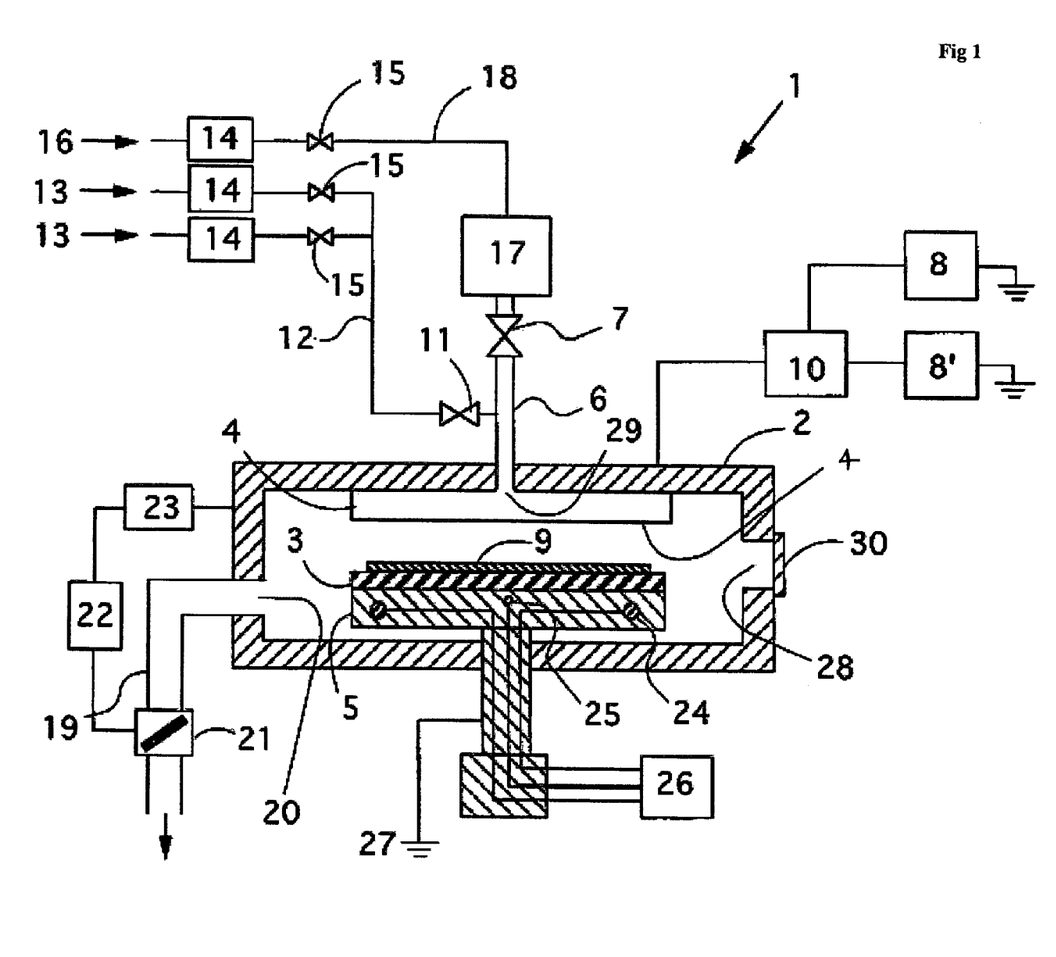
FIG. 1 is a schematic cross-sectional view of an exemplary plasma chemical vapor deposition device.

FIG. 1 is a schematic cross section of an exemplary plasma CVD device according to a preferred embodiment. A plasma CVD device 1, which is used to form a thin film on a semiconductor wafer 9 or other substrate, comprises a reaction chamber 2, a support 3 provided within the reaction chamber to support the semiconductor wafer 9, a showerhead 4 that is positioned to face the support 3 and is used to spray reaction gas uniformly onto the semiconductor wafer 9, an outlet 20 to exhaust reaction gases and byproducts from the reaction chamber 2, and a remote plasma discharge chamber 17. Cleaning gas for the remote plasma chamber 17 is supplied through a conduit 18 having an inlet port 16 leading to a main flow controller 14 and a valve 15. The remote plasma discharge chamber 17 is linked to the showerhead 4 via piping 6 and valve 7. The remote plasma discharge chamber 17 generates active species using radio-frequency oscillating output energy of the designated frequency, and the piping 6 is made of materials that are not corroded by the active species.

The support 3 that is provided within the reaction chamber 2 and that is used to support the semiconductor wafer 9 is made of anodized aluminum alloy and is grounded 27 to constitute one side of an electrode of plasma discharge. The reaction chamber 2 of the illustrated embodiment is thus a plasma CVD chamber configured for in situ (in chamber) plasma generation. The support 3 includes a heater 5 having a ring-shape heating element 24 embedded therein. The semiconductor wafer's temperature is controlled at a predetermined temperature using a temperature controller (not shown). The support 3 is connected to a driving mechanism 26 that moves the support 3 up and down through a support piston 25.

Within the reaction chamber 2, the showerhead 4 is provided at a position facing the support 3. In the showerhead 4, thousands of fine holes are provided to inject reaction gas onto the semiconductor wafer 9. The showerhead is electrically connected to a radio-frequency oscillator 8 and 8' via matching circuit 10 and constitutes another electrode for plasma discharge. To bring reaction gas to be used for film formation from the showerhead 4, a reaction gas conduit 12 is connected to a mass flow controller 14 with a shut-off valve 15 near the outlet from the flow controller and a valve 11 controlling flow to the piping 6. The number of the gas conduits is not limited to one. According to the type of reaction gas, any number of gas conduits can be installed. One end of the gas conduit 12 constitutes a gas inlet port 13 to cause reaction gas to flow in and the other end constitutes a reaction gas exit port to cause gas to flow to the inlet 29 of the showerhead 4.

The outlet 20 is connected to a vacuum exhaust pump (not shown) through piping 19. Between the outlet 20 and the vacuum pump, a conductance-controlling valve 21 is provided to regulate pressure within the reaction chamber 2. The conductance-controlling valve 21 is electrically connected to an external regulator 22 and a pressure gauge 23, preferably provided to measure pressure within the reaction chamber 2. The wafer 9 is inserted into the chamber 2 through a port 28 controlled by a gate valve 30.

The silicon and carbon source may be an alkyl silicon compound having a general formula $Si_xC_yH_z$, where x has a range from 1 to 2, y has a range from 1 to 6, and z has a range from 6 to 20. For example, divinyl-dimethylsilane, tri-methylsilane, and tetra-methylsilane among others maybe used as the alkyl silicon compound. Nitrogen source is ammonia (NH3) and nitrogen (N2). Helium (He), argon (Ar), neon (Ne), krypton (Kr) and xenon (Xe) maybe used for the inert gas.

In general, the deposition process parameters of forming a silicon carbide film on a 200 mm silicon wafer include a substrate temperature range of about 200° C. to about 400° C. (more preferably 330–380° C.), a chamber pressure of about 300 Pa to 1000 Pa, an alkyl silicon compound flow rate of about 100 sccm to 1000 sccm, nitrogen source flow rate such as ammonia (NH3) and nitrogen (N2) of about 100 sccm to 500 sccm and 100 sccm to 1000 sccm respectively, and an inert gas flow rate of about 200 sccm to 5000 sccm. This creates a ratio of the inert gas flow rate to alkyl silicon compound is in the range of about 1:1 to about 1:10. The process also includes a mixed frequency RF power having at least a first RF power with a frequency in a range of about 13 MHz to 30 MHz (high frequency) with a power in a range of about 100 Watts to 2000 Watts; and at least a second RF power with a frequency in a range of about 100 kHz to 500 kHz (low frequency) with a power in the range of about 50 Watts to 500 Watts. Thus the ratio of low frequency to total power is less than about 0.5, and the RF power source generates the electric field. Preferably the first RF power is in the range of 300 to 1000 W and the second RF power is in the range of 50 to 250 W. The second RF power with a frequency in a range of 300 kHz to 450 kHz is preferably used in combination with the first RF power.

The ratio of the second RF power to the total mixed frequency power is preferably less than about 0.5 to 1.0. The above process parameters provide a deposition rate for the silicon carbide layer in the range of about 100 nm/min to 350 nm/min, when implemented on a 200 mm substrate in a deposition chamber.

SiCN Film Formation

As an exemplary process for growing SiCN film on a substrate according to the present invention the parameters listed in TABLES 1 through 3 were used:

TABLE 1

| Parameter | Range |
|---|---|
| Tetra-methylsilane (TMS) flow rate | 10 sccm~1000 sccm |
| Ammonia (NH3) flow rate | 10 sccm~1000 sccm |
| Nitrogen (N2) flow rate | 10 sccm~3000 sccm |
| Helium (He) flow rate | 50 sccm~10000 sccm |
| Pressure | 100 Pa~2000 Pa |
| Low RF Power | 50 W~5000 W |
| High RF Power | 20 W~1000 W |
| Substrate Temperature | 200° C.~450° C. |

TABLE 2

| Parameter | Preferred Range |
|---|---|
| Tetra-methylsilane (TMS) flow rate | 100 sccm~500 sccm |
| Ammonia (NH3) flow rate | 50 sccm~500 sccm |
| Nitrogen (N2) flow rate | 50 sccm~2000 sccm |
| Helium (He) flow rate | 100 sccm~5000 sccm |
| Pressure | 200 Pa~1500 Pa |
| Low RF Power | 100 W~2000 W |
| High RF Power | 50 W~500 W |
| Substrate Temperature | 250° C.~400° C. |

TABLE 3

| Parameter | More Preferred Range |
|---|---|
| Tetra-methylsilane (TMS) flow rate | 200 sccm~300 sccm |
| Ammonia (NH3) flow rate | 100 sccm~300 sccm |
| Nitrogen (N2) flow rate | 100 sccm~1000 sccm |
| Helium (He) flow rate | 500 sccm~3000 sccm |
| Pressure | 300 Pa~1000 Pa |
| Low RF Power | 200 W~1000 W |
| High RF Power | 50 W~200 W |
| Substrate Temperature | 300° C.~380° C. |

Film Forming Conditions/Sequence

To deposit SiCN layer on 200 mm wafer, a reactive gas source such as tetra-methylsilane (TMS) and a substantial source of nitrogen such as ammonia (NH3) and nitrogen (N2) is introduced into the reaction zone. Helium can be used as an inert gas.

Figure 3:
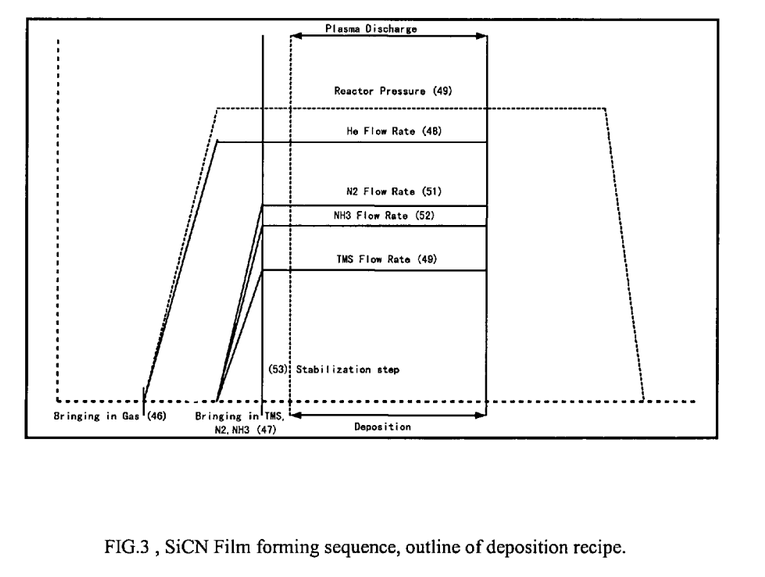
FIG. 3 illustrates an exemplary sequence (deposition recipe) for forming a SiCN film.

FIG. 3 discloses an example of the present invention. After a semiconductor substrate is carried into a reaction chamber and is heated at a given temperature, in the step 46 'Bringing in He', helium 48, which is an inert gas, is brought into the reaction chamber at a determined flow within the limits of 100 sccm to 3000 sccm, controlling the pressure inside the reaction chamber 49 at a determined value within the limits of 300 Pa to 1000 Pa. In step 47 'Bringing in TMS, N2 and NH3', TMS 50 is brought into the reaction chamber at a determined flow within the limits of 200 sccm to 300 sccm, N2 51 is brought into the reaction chamber at a determined flow within the limits of 100 sccm to 1000 sccm and NH3 52 is brought into the reaction chamber at a determined flow within the limits of 100 sccm to 300 sccm. For bringing in He, N2, NH3 and TMS gas, a ramp-up method in which a flow of respective gases is increased from zero to a given value at a specific rate during predetermined time frames is adopted. This method is used to prevent floating of particles in the reaction chamber and adhering of the particles to the semiconductor substrate. Such a phenomenon is caused by a rise in a pressure in the reaction chamber resulted from the drastic gas flow into the reaction chamber.

Once the gas flow such as TMS, NH3, N2 and He is stabilized as shown in step 53, RF power with a frequency of 27.12 MHz is applied in the range of 200 to 1000 W and RF power with a frequency 400 kHz is applied in the range of 50 to 500 W. In this step silicon carbide film is formed.

The basic film properties of the SiCN film deposited above are shown in TABLE 5. Furthermore, no major changes either to dielectric constant or to stress of this film were observed even when exposed to air at room temperature of 20° C. to 30° C.

Furthermore, when annealing is performed at 400° C. under nitrogen atmosphere for 10 hours, a change in the film stress is observed but still it remains compressive. The change in the stress is less than about 100 MPa. It is presumed that the SiCN film deposited according to the embodiments described above has a good thermal stress behavior. As mentioned earlier in the introduction films with high compressive stress provides better adhesion with copper. It can also be presumed that due to not changing the stress from compressive to tensile, good adhesion behavior between barrier insulating film and inter dielectric layer is expected. Leakage current and dielectric constant of silicon carbide film at 1 MV/cm is less than that of $1\times10^{-8}$ A/cm$^2$ and less than 5.0 respectively which consequently suggests that the silicon carbide films according to this embodiment is suitable to use as copper diffusion barrier layer as well as etch stopper.

The silicon carbide films deposited by the PECVD process described herein have significantly lower concentration of hydrogen which result in lower dielectric constant, lower leakage current and high compressive stress in comparison to the conventional silicon carbide films. The silicon carbide films can be deposited without a mixture of low and high frequency. However, the preferred mixture of high and low radio frequency corrects adverse film properties caused by the bombardment of the silicon carbide film with molecules of inert gas. Increasing the ratio of Si—C bonds in the film provides greater hardness and high elastic modulus in the silicon carbide film.

The following example illustrates a dual damascene structure in which a silicon carbide layer deposited according to the present invention can be used. FIG. 2a–2i shows a dual damascene structure in which a silicon carbide layer deposited according to the present invention can be used. A copper (Cu) layer (31) is first covered with a first silicon carbide layer (32). Since the silicon carbide layer (32) according to this embodiment is oxygen free with low leakage current and low dielectric constant, it is suggested to be the most suitable material to use as a copper diffusion barrier layer. Before depositing the silicon carbide layer (32), the copper surface can be improved by removing any copper oxide that may be remaining on the surface. Typically a hydrogen (H$_2$) or an ammonia (NH$_3$) or methane (CH$_4$) plasma based reduction is used before the deposition of silicon carbide layer (32). This copper surface reduction to remove CMP residue can be performed in a PECVD chamber.

Figure 2A:
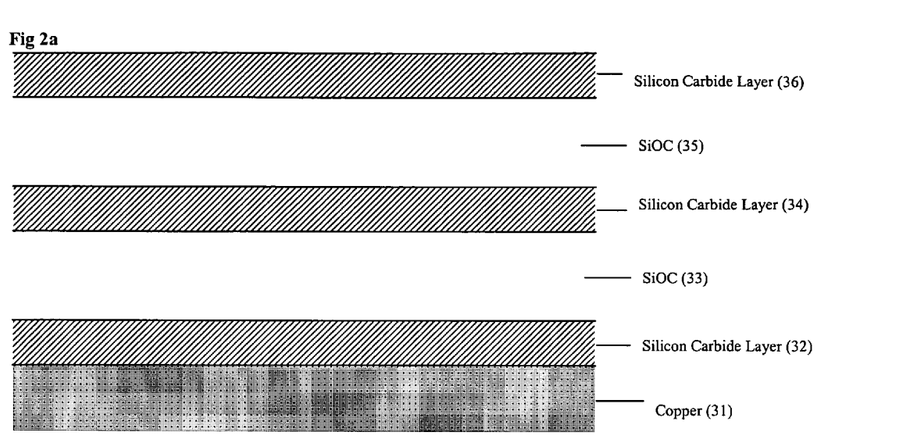
FIGS. 2a–2i illustrate a dual damascene structure in which a silicon carbide layer can be used.
Figure 2B:
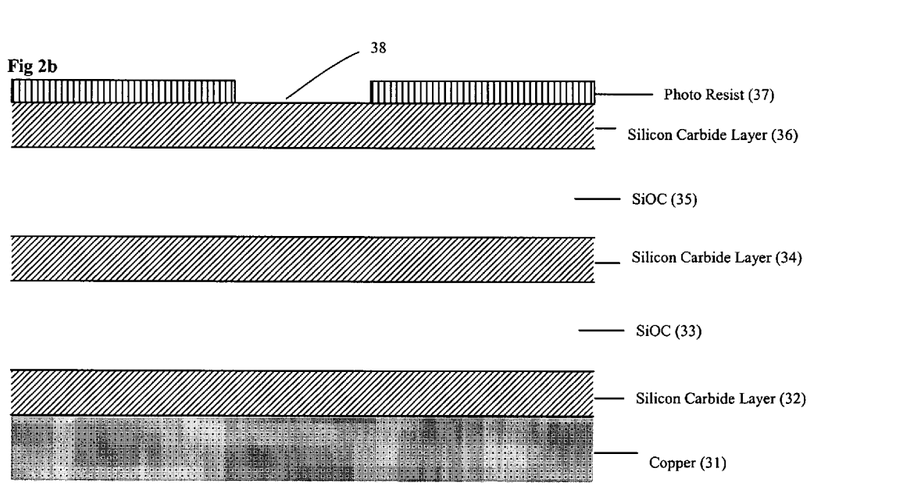
Figure 2C:
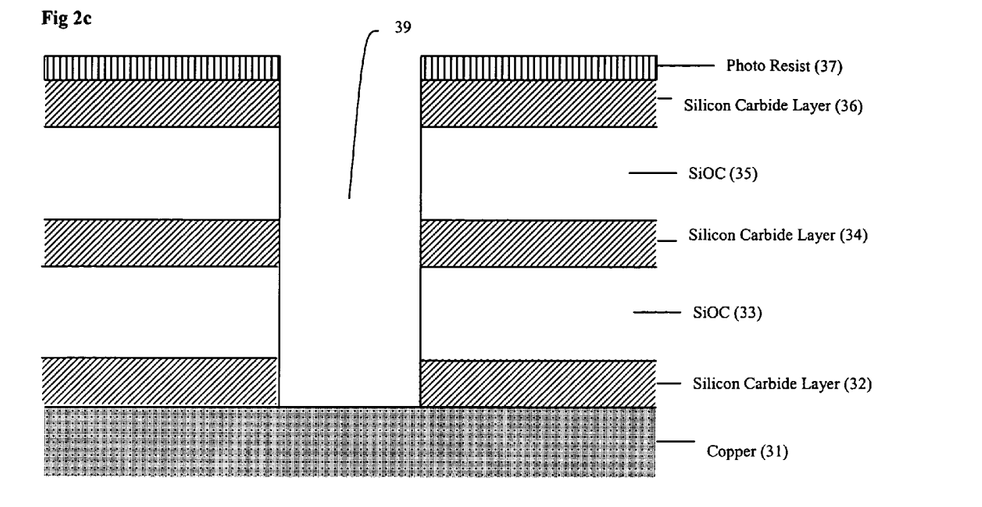

After the deposition of silicon carbide layer (32), a first inter level dielectric, in this case SiOC layer (33), is deposited. After the deposition of the SiOC layer (33), the second silicon carbide layer (34) and second inter level dielectric, in this case SiOC layer (35) and the silicon carbide layer (36), are deposited in sequence as shown in FIG. 2a. A photo resist (37) is then coated on top of the third silicon carbide layer (36) as shown in FIG. 2b. To form via holes and trenches, any suitable methods can be employed. The following is an example:

A via hole (39) is formed by etching. The process of forming a via hole is stated as follows: First a photo resist (37) is removed (38) as shown in FIG. 2b. Next, a via etching is commenced through the third silicon carbide layer (36) to the first silicon carbide layer (32) as shown in FIG. 2c. Finally, a portion of first silicon carbide layer (32) is etched to expose the metal line.

Figure 2D:
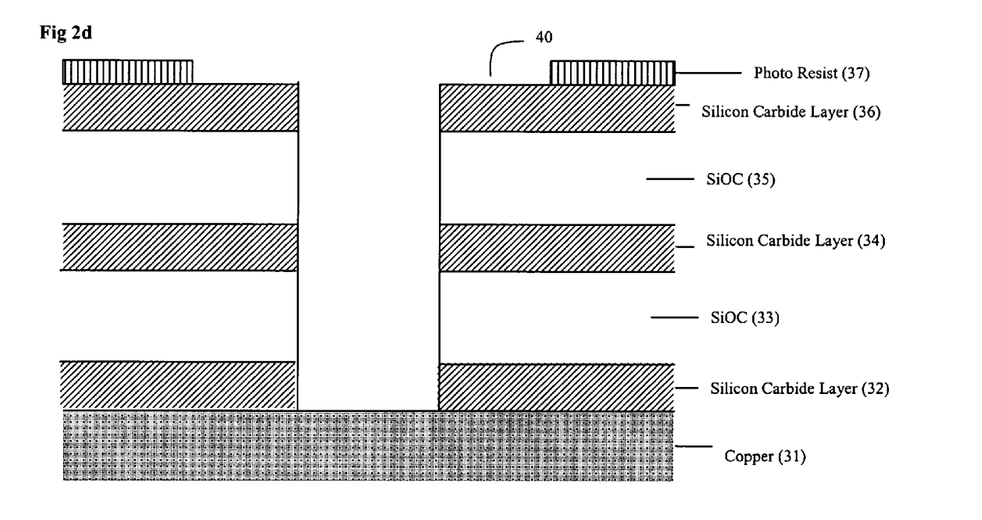
Figure 2E:
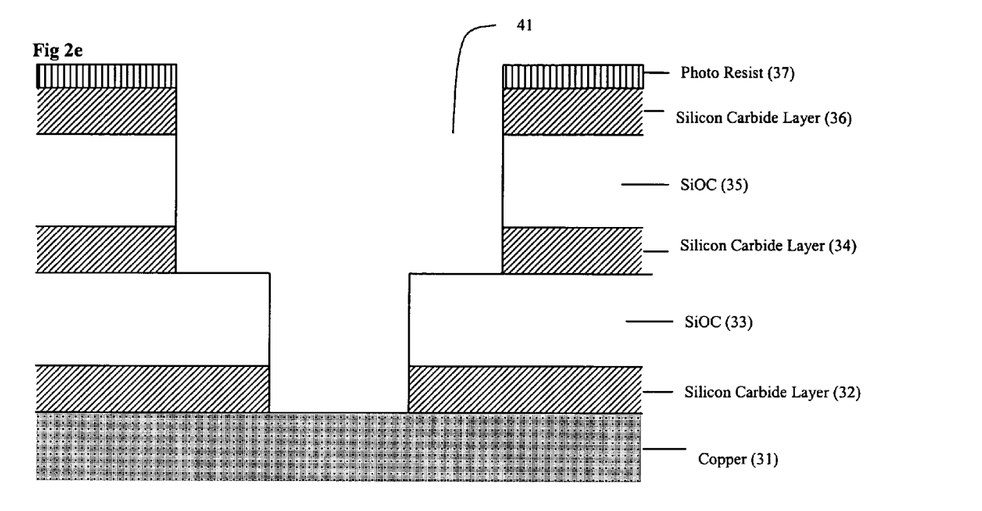

After via realization, trench patterning commences. First, a photo resist (37) is removed as shown in FIG. 2d. Next, trench (41) is formed through etching third silicon carbide layer (36) to second silicon carbide layer (34) as shown in FIG. 2e. The second silicon carbide layer (34) prevents the etching of the second SiOC layer (35) from continuing into the first SiOC layer (33).

Figure 2F:
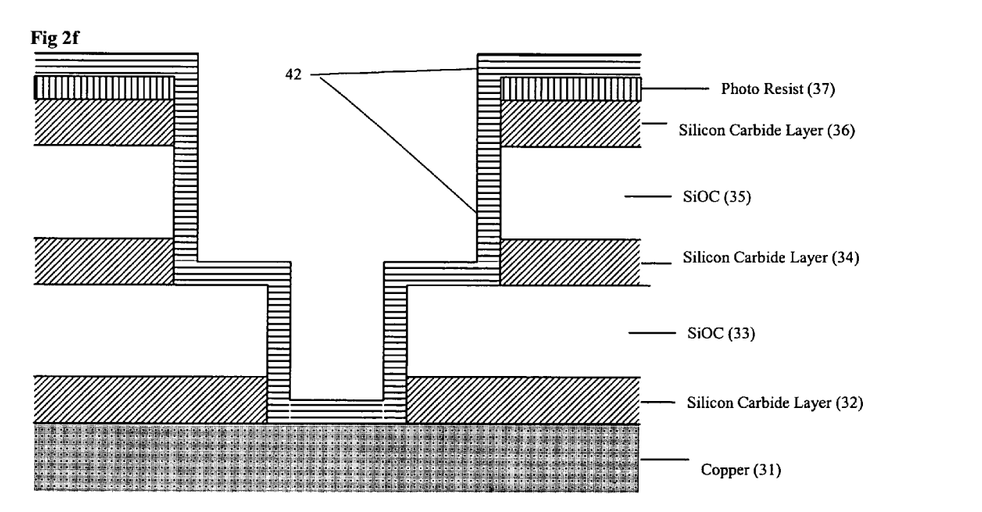
Figure 2G:
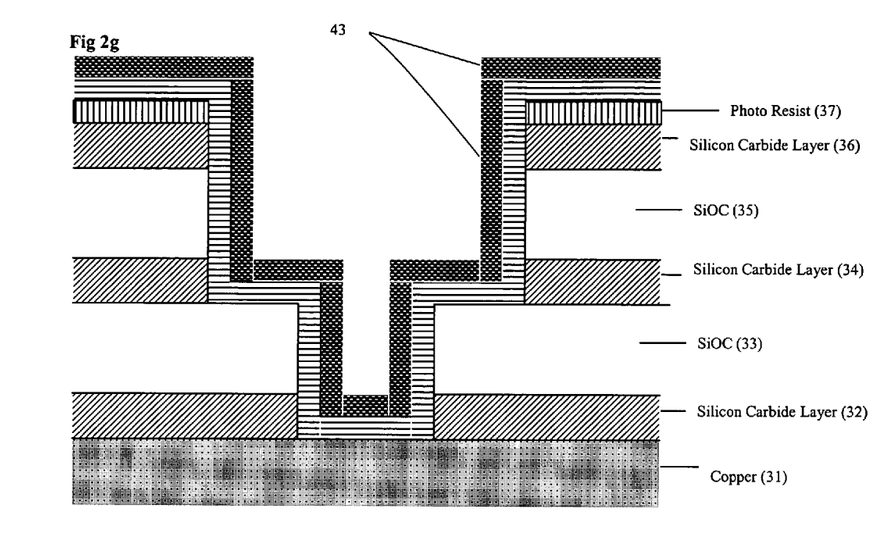
Figure 2H:
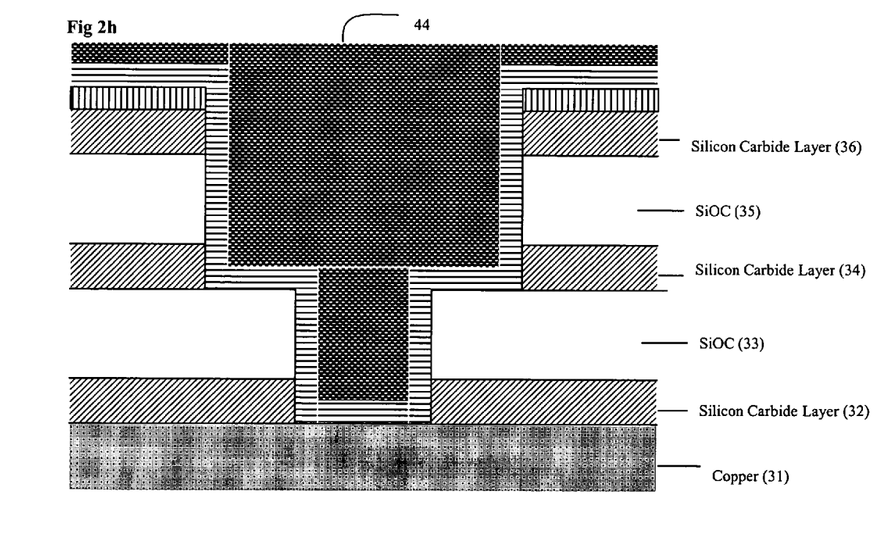
Figure 2I:
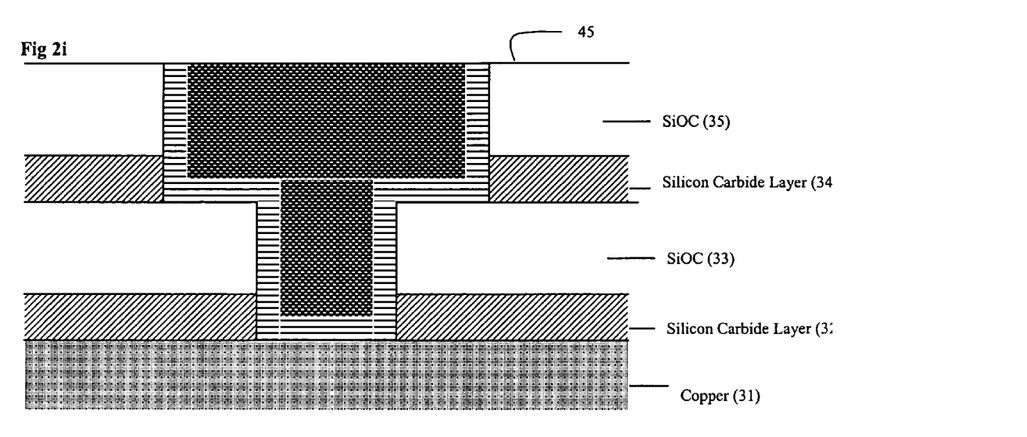

A copper barrier layer such as TaN or TiN (42), is formed inside the via hole, which also covers top of the resist as shown in FIG. 2f. A copper seed layer (43) is further deposited by PVD, or the like. Thereafter copper (44) is then deposited in the hole by electric plating or the like. By CMP or the like, the copper barrier layer (42), the copper (44), the resist (37) and the third silicon carbide layer (36), are removed so that the surface (45) is exposed.

A silicon carbide layer can also be deposited as a passivation layer (not shown) for protecting the device from scratching. The silicon carbide dielectric diffusion barrier (DDB) layer is important as it effectively prevents copper diffusion into the SiOC layers. This is due to the DDB layer having a low leakage current.

The leakage current and stress of conventional silicon carbide barrier layer at 1 MV/cm is approximately $1\times10^{-7}$ A/cm$^2$ and 100 MPa when compared to that of approximately $1\times10^{-9}$ A/cm$^2$ and above 200 MPa respectively in a silicon carbide barrier layer fabricated as described herein. Thus, using a conventional silicon carbide barrier layer, as opposed to a silicon carbide layer fabricated as described herein, at an electric field of 2 MV/cm, maintains the same effectiveness in preventing the copper diffusion. Furthermore, the resulting silicon carbide layer has a relatively low dielectric constant, typically around 4.5 and 5.0, depending on the mixture and ratio of low frequency to the total frequency generated during deposition, and also depending on the ratio of gases used to form the silicon carbide.

The film formation was conducted according the deposition conditions shown in Table 4 below.

TABLE 4

| Parameter | Condition A | Condition B | Condition C |
|---|---|---|---|
| Tetra-methylsilane (TMS) flow rate (sccm) | 180 | 200 | 180 |
| Ammonia (NH3) flow rate (sccm) | 250 | 250 | 250 |
| Nitrogen (N2) flow rate (sccm) | 600 | 600 | 600 |
| Helium (He) flow rate (sccm) | 2600 | 3000 | 2600 |
| Pressure (Pa) | 665 | 700 | 665 |
| Low RF Power (W) | 70 | 100 | 100 |
| High RF Power (W) | 550 | 550 | 550 |
| Substrate Temperature (° C.) | 380 | 380 | 380 |

An as-deposited silicon carbide layer has a dielectric constant and leakage current at 1 MV/cm less than about 5.0 and $1\times10^{-8}$ A/cm$^2$, respectively, making it suitable for use as an insulating material in integrated circuits. The details of the film properties such as dielectric constant, leakage current and film stress of the silicon carbide layer deposited according to the deposition conditions A, B and C is shown in Table 5. The dielectric constant of the silicon carbide layer is tunable, in that it can be varied as a function of the ratio of the mixed frequency RF powers. In particular, as the ratio of the low frequency RF power to the total mixed powers decreases, the dielectric constant of the silicon carbide layer also decreases.

The dielectric constant of the silicon carbide layer can also be tuned as a function of the composition of the gas mixture during layer formation. As the carbon concentration in the gas mixture increases, the carbon content of the as-deposited silicon carbide layer increases, making the silicon carbide film less dense and dielectric constant decrease. Also, as the carbon concentration of the as deposited silicon carbide layer increases, the hydrophobic properties thereof increases making such layers suitable for use as moisture barriers in integrated circuits.

In addition, the as-deposited silicon carbide layer has no oxygen content. It is believed that such an oxygen free silicon carbide layer minimizes metal diffusion and improves the barrier layer properties. For example, the as-deposited silicon carbide layer has a current blocking ability at 1 MV/cm that is less than that about $1\times10^{-8}$ A/cm$^2$, which is suitable for minimizing cross-talk between integrated circuit interconnect structures.

The etching performance of silicon carbide materials shows that the etch selectivity, based on RIE (reactive ion etching) etching mode, between SiOC and silicon carbide described herein was from 5 to 10.

TABLE 5

| Film type | Film Stress Compressive (MPa) | Dielectric constant | Leakage current at 1 MV/cm (A/cm$^2$) |
|---|---|---|---|
| SiCN (Condition A) | 220 ± 20 | 4.6 ± 0.1 | <3 × 10$^{-9}$ |
| SiCN (Condition B) | 270 ± 20 | 4.7 ± 0.1 | <4 × 10$^{-9}$ |
| SiCN (Condition C) | 280 ± 20 | 4.8 ± 0.1 | <5 × 10$^{-9}$ |

What is claimed is:

1. A method for depositing a nitrogen-doped silicon carbide layer onto a substrate, the method comprising:
   providing a silicon and carbon source gas comprising a non-alicyclic alkyl silicon compound, a nitrogen source gas comprising ammonia, and an inert gas into a reaction zone, the reaction zone containing the substrate;
   producing an electric field in the reaction zone, the electric field generated using low and high frequency RF energy produced by an RF power supply, the RF power supply generating an average power at an electrode surface used for plasma discharge in the reaction zone; and
   reacting the silicon and carbon source gas and the nitrogen source gas to deposit on the substrate a nitrogen-doped silicon carbide film;
   wherein the RF power supply generates high frequency RF power having a frequency between about 13 MHz and about 30 MHz and low frequency RF power having a frequency between about 100 kHz and about 500 kHz during a processing period, wherein a ratio of the low frequency RF power to a total RF power is more than 0 but no more than about 0.15.

2. The method of claim 1, wherein:
   the high frequency RF power has a power between about 200 watts and about 1000 watts; and
   the low frequency RF power has a power between about 50 watts and 500 watts.

3. The method of claim 1, wherein the average power at the electrode surface is substantially constant.

4. The method of claim 1, wherein the silicon and carbon source gas is one of the following: tri-methylsilane, tetramethylsilane, or divinyl-dimethylsilane.

5. The method of claim 1, wherein the inert gas is one of the following: helium, argon or krypton.

6. A method of claim 1, wherein the nitrogen source consists of ammonia (NH3).

7. The method of claim 1, wherein the ratio of the silicon and carbon source gas to the inert gas is between about 1:1 and about 1:15.

8. The method of claim 1, wherein the silicon and carbon source gas is provided into the reaction zone at a rate between about 200 sccm and about 500 sccm.

9. The method of claim 1, wherein the substrate is heated to a temperature between about 200° C. and about 400° C.

10. The method of claim 1, wherein the reaction zone is maintained at a pressure between about 300 Pa and about 1000 Pa.

11. The method of claim 1, wherein the silicon carbide layer is nitrogen-doped, and wherein the nitrogen-doped silicon carbide layer has a dielectric constant less than about 5.0.

12. The method of claim 1, wherein the silicon carbide layer has a compressive film stress of above 200 MPa.

13. The method of claim 12, wherein the silicon carbide layer has a leakage current of less than $1\times10^{-8}$ A/cm2 at an electric field of 1 MV/cm.

14. The method of claim 12, wherein the reaction zone is maintained at a pressure between about 500 Pa and about 700 Pa.

15. The method of claim 14, wherein the substrate is heated to a temperature between about 320° C. and about 350° C.

16. The method according to claim 1, wherein the film is an etch stop layer.

17. The method according to claim 1, wherein the film is a hard mask.

18. A method for manufacturing on a semiconductor substrate an interlayer structure containing a film in contact with a copper layer, comprising the steps of:
   (i) forming multiple layers on a semiconductor substrate;
   (ii) forming a hole for an interlayer connection of the multiple layers by etching;
   (iii) depositing copper in the hole;
   (iv) removing an excess of the copper from a top of the multiple layers;
   (v) depositing a nitrogen-doped silicon carbide film on the top of the multiple layers by the method of claim 1, wherein the copper is covered by the silicon carbide film.

19. The method according to claim 18, wherein the multiple layers comprise a lower etch stop layer, a lower low dielectric layer, an intermediate etch stop layer, an upper low dielectric layer, and in step (ii) an upper etch stop layer laminated in sequence on the substrate, and the hole is produced by forming a resist on top of the upper etch stop layer and forming a via hole and trench by etching the multiple layers using the resist, and in step (iv) the resist and the upper etch stop layer are removed when removing the excess of the copper.

20. The method according to claim 18, wherein prior to step (i), a low dielectric layer is formed on the substrate, and the multiple layers are formed on top of the low dielectric layer.

21. The method according to claim 18, wherein steps (i) through (iv) are repeated at least once.

22. A method for depositing a nitrogen-doped silicon carbide layer onto a substrate, the method comprising:
   introducing a non-alicyclic alkyl silicon compound, ammonia, and an inert gas into a reaction zone containing the substrate therein, wherein a flow ratio of the non-alicyclic alkyl silicon compound to the inter gas is between about 1:1 and about 1:15;
   producing an electric field in the reaction zone, the electric field generated using low and high frequency RF energy produced by an RF power supply, the RF power supply generating an average power at an electrode surface used for plasma discharge in the reaction zone; and reacting the silicon and carbon source gas and the nitrogen source gas to deposit on the substrate a nitrogen-doped silicon carbide film;

wherein the RF power supply generates high frequency RF power having a frequency between about 13 MHz and about 30 MHz and low frequency RF power having a frequency between about 100 kHz and about 500 kHz during a processing period, wherein a ratio of the low frequency RF power to a total RF power is more than 0 but no more than about 0.15.

23. The method of claim 22, wherein a flow rate of the non-alicyclic alkyl silicon compound is 100–500 sccm, a flow rate of the ammonia is 50–500 sccm, and a flow rate of the inert gas is 100–5,000 sccm.

24. The method of claim 22, wherein the ammonia is the sole source of nitrogen.

25. The method of claim 22, wherein the silicon carbide layer has a compressive film stress of above 200 MPa and a leakage current of less than $1\times10^{-8}$ $A/cm^2$ at an electric field of 1 MV/cm.

26. The method of claim 22, wherein the silicon carbide layer has a dielectric constant of 4.5 to 5.0.

* * * * *